United States Patent
Goldstein

(10) Patent No.: US 9,293,128 B2
(45) Date of Patent: Mar. 22, 2016

(54) ACTIVE NOISE CONTROL WITH COMPENSATION FOR ACOUSTIC LEAK IN PERSONAL LISTENING DEVICES

(71) Applicant: Apple Inc., Cupertino, CA (US)

(72) Inventor: Andre L. Goldstein, San Jose, CA (US)

(73) Assignee: Apple Inc., Cupertino, CA (US)

( * ) Notice: Subject to any disclaimer, the term of this patent is extended or adjusted under 35 U.S.C. 154(b) by 83 days.

(21) Appl. No.: 14/187,240

(22) Filed: Feb. 22, 2014

(65) Prior Publication Data

US 2015/0243271 A1    Aug. 27, 2015

(51) Int. Cl.

| G10K 11/16 | (2006.01) |
|---|---|
| G10K 11/175 | (2006.01) |
| H03G 3/20 | (2006.01) |
| G10L 21/0208 | (2013.01) |
| G10K 11/178 | (2006.01) |
| H04R 25/00 | (2006.01) |
| H04R 1/10 | (2006.01) |

(52) U.S. Cl.
CPC .......... *G10K 11/175* (2013.01); *G10K 11/1784* (2013.01); *G10L 21/0208* (2013.01); *H03G 3/20* (2013.01); *H04R 1/1083* (2013.01); *H04R 25/505* (2013.01); *G10K 2210/3213* (2013.01); *H04R 2410/05* (2013.01); *H04R 2460/01* (2013.01)

(58) Field of Classification Search
None
See application file for complete search history.

(56) References Cited

U.S. PATENT DOCUMENTS

| 8,401,200 B2 | 3/2013 | Tiscareno et al. |
|---|---|---|
| 2011/0142247 A1* | 6/2011 | Fellers ................. G10K 11/178 381/71.1 |
| 2012/0155667 A1 | 6/2012 | Nair |
| 2013/0094657 A1 | 4/2013 | Brammer et al. |
| 2013/0114821 A1 | 5/2013 | Hamalainen |
| 2013/0259250 A1 | 10/2013 | Nicholson et al. |
| 2013/0301847 A1 | 11/2013 | Alderson et al. |
| 2015/0104032 A1* | 4/2015 | Kwatra .............. G10K 11/1784 381/71.11 |

OTHER PUBLICATIONS

Bajic, Vladan, et al., "Audio Headset with Automatic Equalization", U.S. Appl. No. 13/631,475, filed Sep. 28, 2012, First Named Inventor: Vladan Bajic, Whole Document.

Clemow, Richard, "Fundamentals of Ambient Noise Cancellation for Headphones and Handsets", Published on Electronic Component News (http"//www.ecnmag.com), Oct. 20, 2010, Internet document at: www.ecnmag.com/print/articles/2010/10/fundamentals-ambient-noise-cancellation-headphones-and-handsets, (4 pages).

Goldstein, Andre L., et al., "Adaptive Audio Equalization for Personal Listening Devices", U.S. Appl. No. 13/896,164, filed May 16, 2013, First Named Inventor: Andre L. Goldstein, Whole Document.

(Continued)

*Primary Examiner* — Muhammad N Edun

(74) *Attorney, Agent, or Firm* — Blakely, Sokoloff, Taylor & Zafman LLP

(57) ABSTRACT

An acoustic noise cancellation (ANC) process is performed during in-the-field use of a personal listening audio device, using a control filter to produce anti-noise by the device. The process includes computing an S_hat filter that estimates a signal path between an earpiece speaker of the device and an error microphone that are at a user's ear. A response associated with the computed S_hat filter is compared to a predetermined response that is stored in the device. The control filter is adjusted in accordance with the comparison. Other embodiments are also described and claimed.

23 Claims, 7 Drawing Sheets

(56) References Cited

OTHER PUBLICATIONS

Jones, Oliver, "Challenges Await in Noise-Cancelling Headset Design", Electronic Design, Jun. 13, 2012, Analog content from Electronic Design, Internet document at: electronic design.com/print/analog/challenges-await-noise-cancelling-headset-design, (6 pages).

Clemow, Richard, "Fundamentals of Ambient Noise Cancellation for Headphones and Handsets", Published on Electronic Component News http//www.ecnmag.com), Oct. 20, 2010, Internet document at: www.ecnmag.com/print/articles/2010/10/fundamentals-ambient-noise-cancellation-headphones-and-handsets, 4 pages.

Goldstein, Andre L., et al., "Active Noise Control with Compensation for Error Sensing at the Eardrum", U.S. Appl. No. 13/965,767, filed Aug. 13, 2013, First Named Inventor: Andre L. Goldstein, Whole Document.

Goldstein, Andre L., et al., "Adaptive Audio Equalization for Personal Listening Devices", U.S. Appl. No. 13/896,164, filed May 16, 2013, Whole Document.

Jones, Oliver, "Challenges Await in Noise-Cancelling Headset Design", Electronic Design, Jun. 13, 2012, Analog content from Electronic Design, Internet document at: electronicdesign.com/print/analoq/challenges-await-noise-cancelling-headset-design. 6 pages.

Po, Bruce C., et al., "Robust Process for Managing Filter Coefficients in Adaptive Noise Canceling Systems", U.S. Appl. No. 13/607,755, filed Sep. 9, 2012, First Named Inventor: Bruce C. Po, Whole Document.

* cited by examiner

ACTIVE NOISE CONTROL WITH COMPENSATION FOR ACOUSTIC LEAK IN PERSONAL LISTENING DEVICES

An embodiment of the invention relates to personal listening audio devices such as earphones and telephone handsets, and in particular the use of acoustic noise cancellation or active noise control (ANC) to improve the user's listening experience by attenuating external or ambient background noise. Other embodiments are also described.

BACKGROUND

It is often desirable to use personal listening devices when listening to music and other audio material, or when participating in a telephone call, in order to not disturb others that are nearby. When a compact profile is desired, users often elect to use in-ear earphones or headphones, sometimes referred to as earbuds. To provide a form of passive barrier against ambient noise, earphones are often designed to form some level of acoustic seal with the ear of the wearer. In the case of earbuds, silicone or foam tips of different sizes can be used to improve the fit within the ear and also improve passive noise isolation.

With certain types of earphones, such as loose fitting earbuds, there is significant acoustic leakage between the atmosphere or ambient environment and the user's ear canal, past the external surfaces of the earphone housing and into the ear. This acoustic leakage could be due to the loose fitting nature of the earbud housing, which promotes comfort for the user. However, the additional acoustic leakage does not allow for enough passive attenuation of the ambient noise at the user's eardrum. The resulting poor passive acoustic attenuation can lead to lower quality user experience of the desired user audio content, either due to low signal-to-noise ratio or speech intelligibility especially in environments with high ambient or background noise levels. In such a case, an ANC mechanism may be effective to reduce the background noise and thereby improve the user's experience.

ANC is a technique that aims to "cancel" unwanted noise, by introducing an additional, electronically controlled sound field referred to as anti-noise. The anti-noise is electronically designed so as to have the proper pressure amplitude and phase that destructively interferes with the unwanted noise or disturbance. An error sensor (typically an acoustic error microphone) is provided in the earphone housing to detect the so-called residual or error noise. The output of the error microphone is used by a control system to adjust how the anti-noise is produced, so as to reduce the ambient noise that is being heard by the wearer of the earphone.

The amplitude and phase characteristics of the anti-noise needed for achieving effective noise control are a result of processing the noise, as captured by one or more sensors, through a control filter. An ANC system in general can be implemented in a feedback or a feed forward topology, or a hybrid topology. Generally, the control filter processes ambient noise content that has been measured or is contained in the output of a sensing microphone (for example, the error microphone and in some cases also a reference microphone). The control filter does so based on an assumption that a certain electroacoustic response exists between the earphone speaker driver and the error microphone, when the earphone has been placed in or against the ear. This electroacoustic response is often referred to as the plant S, or the secondary acoustic path transfer function $S(z)$, where this reference is in view of a primary acoustic path $P(z)$ that is taken by the disturbance in arriving at the error microphone. In a feedback type of ANC system, a signal representing the residual error (reflecting the disturbance) as picked up by the error microphone is fed to the control filter, which in turn produces the anti-noise. The control filter is intended to create an anti-noise that destructively interferes with the disturbance that has arrived at the error microphone through the primary acoustic path. In a feed forward system, the input signal to the control filter is derived from the output of a reference microphone which is located so as to pickup the disturbance before the disturbance has passed through the primary acoustic path. In a hybrid approach, elements of the feed forward and feedback topologies are combined to produce an anti-noise based on both an output of the reference microphone and an output of the error microphone.

SUMMARY

The size of the acoustic leakage between the earpiece speaker and the user's ear can vary between different users of a personal listening audio device (e.g., an earbud, an over the ear headphone, a mobile phone handset), and also for different instances of normal use of the audio device by the same user. This may be due to different fits inside the ear, or different holding positions of the earpiece speaker housing against the outside of the ear during in-the-field use ("online" use). This variation in acoustic leakage impacts the secondary acoustic path transfer function $S(z)$ of the device-ear combination, which impacts how effective an active noise control (ANC) process can be in determining the proper anti-noise to be produced.

In accordance with an embodiment of the invention, additional signal processing is performed during in-the-field use of a personal listening device so that the control filter of a running ANC process is in effect compensated, or one or more parameters of the control filter are changed, according to observed variations in $S(z)$ that may be due to a changing acoustic leakage condition of the device. In other words, the control filter, which may be a programmable digital filter, is modified directly based on information contained in an estimate of $S(z)$, which enables the resulting anti-noise to better match a wide range of acoustic leaks (that may be caused by different earphone fits within the users ear, or different ways in which a phone handset is held against the ear). Several techniques for doing so are described.

The above summary does not include an exhaustive list of all aspects of the present invention. It is contemplated that the invention includes all systems and methods that can be practiced from all suitable combinations of the various aspects summarized above, as well as those disclosed in the Detailed Description below and particularly pointed out in the claims filed with the application. Such combinations have particular advantages not specifically recited in the above summary.

BRIEF DESCRIPTION OF THE DRAWINGS

The embodiments of the invention are illustrated by way of example and not by way of limitation in the figures of the accompanying drawings in which like references indicate similar elements. It should be noted that references to "an" or "one" embodiment of the invention in this disclosure are not necessarily to the same embodiment, and they mean at least one.

DETAILED DESCRIPTION

Several embodiments of the invention with reference to the appended drawings are now explained. Whenever the shapes, relative positions and other aspects of the parts described in the embodiments are not clearly defined, the scope of the invention is not limited only to the parts shown, which are meant merely for the purpose of illustration. Also, while numerous details are set forth, it is understood that some embodiments of the invention may be practiced without these details. In other instances, well-known circuits, structures, and techniques have not been shown in detail so as not to obscure the understanding of this description.

Figure 2:
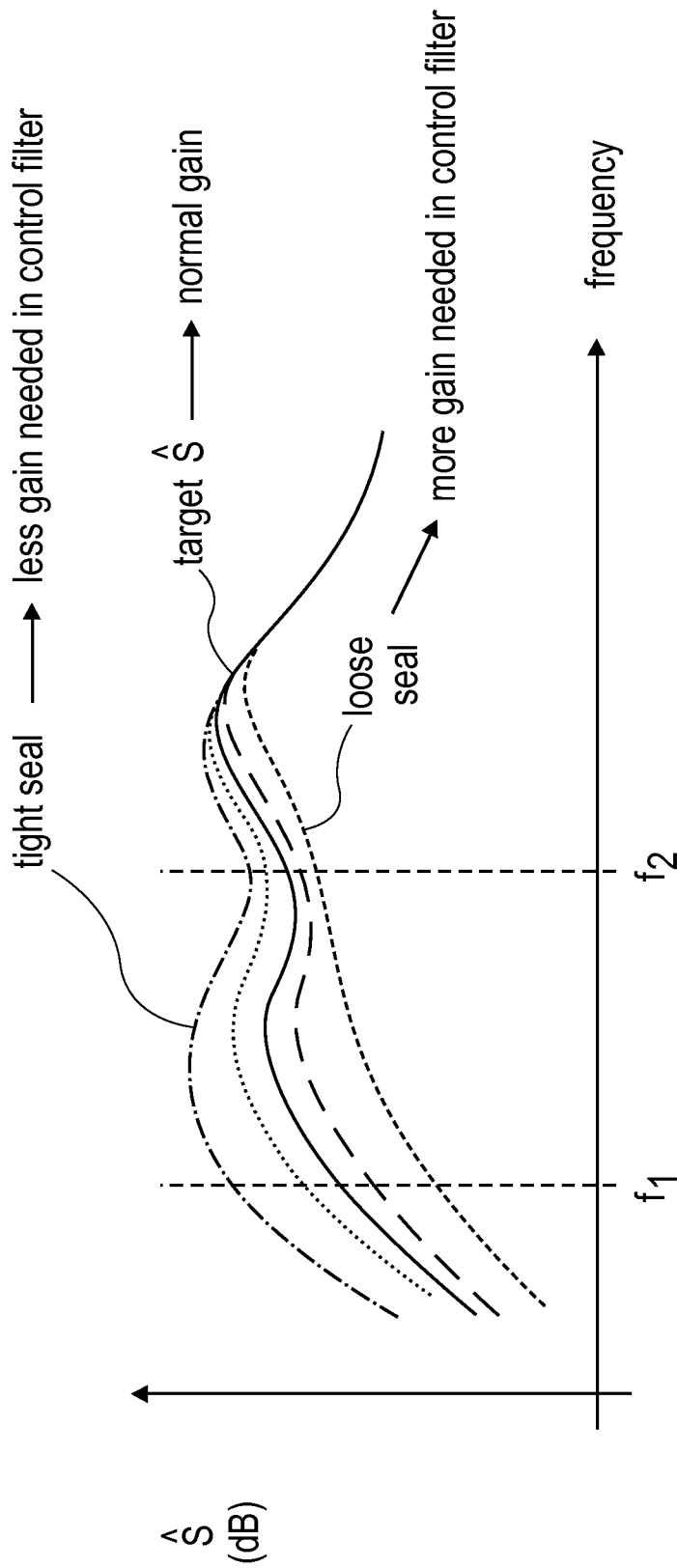
FIG. 2 shows plots of several example magnitude response curves being estimates of a secondary acoustic path transfer function S, obtainable during off-line testing.

One aspect of the invention involves characterizing, for example in a test setting or laboratory-type setting ("offline" use), a number of different acoustic leak scenarios. The characterization process may begin with defining a digital filter that estimates the S(z) transfer function for a given audio device, in a given acoustic leak condition. This is also referred to as computing an instance of S_hat(z). Then, a signal generator (e.g., a white noise source, an impulse source) is applied to stimulate that instance of S_hat(z) while its output response is recorded. In one embodiment, a band pass filter f1-f2 may then be used to isolate a desired frequency band, e.g. 200-400 Hz, of the response; the strength of that band is computed (e.g., an energy value, an RMS power value). This gives an indication of, or an estimate of, the size of the acoustic leak associated with that instance of S_hat(z). This process is repeated so that a range of S_hat(z) filters corresponding to a range of acoustic leak conditions for the device are computed, and each instance of S_hat(z) is stimulated in the same way. FIG. 2 shows an example of the responses converted into frequency domain and plotted, as a magnitude (in dB) vs. frequency graph, for several different seal conditions (acoustic leak conditions). The strength of the selected frequency band f1-f2 in the responses is computed for each instance of S_hat(z). This yields in essence a table of such strength computations, representing estimates of the different leakage conditions. For a tight seal condition (low leakage), the computed strength is large; this is interpreted to mean that less gain is needed in the control filter of the ANC process (that is producing the anti-noise). A loose seal (high leakage) condition is interpreted to mean that more gain is needed in the control filter. A number of intermediate seal conditions are also shown, one of which may be deemed a "target" condition that may be interpreted to mean that the control filter should be configured so as to have a "normal" gain.

For each of the leakage estimates, a respective ANC control filter is then defined. For example, a respective $G_{adapt}(z)$ or $W_{adapt}(z)$ is defined that exhibits the desired gain over a desired frequency band f1-f2 (e.g., as indicated in FIG. 2). Gadapt(z) and Wadapt(z) are digital control filters that are used in an ANC process to produce the anti-noise signal y(n).

In one embodiment, each of these digital filters can be specified by its coefficients, which may be stored with the associated leakage estimate as part of a look up table in each production specimen of the audio device. Alternatively, the filter specification may be given as a number of characteristic filter parameters, such as a filter order, a cut-off frequency, a quality factor (Q), and others, which may be stored in association with each leakage estimate; in that case, the coefficients of the digital filter can be computed online, based on an initial determination (using the strength computation) that yields the appropriate characteristic filter parameters. The resolution is at least two different strength computations (representing two different leakage estimates), but the number can be higher if more precision is needed. Note also that each of these strength computations may have a small spread (tolerance or range) associated with it. One of the strength computations may be designated to be a "target", e.g. a statistical central tendency, such as an average, of a number of the computations that correspond to a large number of leak conditions, obtained for example when the audio device fits comfortably for a large number of users.

Thereafter, during in-the-field use of a production specimen of the audio device, the secondary acoustic path S(z) is identified, e.g. estimated by computing a "current" S_hat(z) filter using an adaptive control process. In one embodiment, a strength computation (similar to the one used above in the offline setting) is then performed upon output of the current S_hat(z) filter while stimulating the filter (in the same way as done in the laboratory), and based on the computed strength a lookup table of pre-determined strengths is consulted to find the closest entry. That entry may yield an updated definition of the control filter, Gadapt(z) or Wadapt(z), which is used by the ANC controller of the audio device to produce the antinoise. The ANC controller once updated with the new control filter may be expected to provide better noise cancellation performance by the audio device, for the particular secondary acoustic path in which the device finds itself. This online process can be repeated in the presence of different acoustic leakage conditions, thereby adapting the control filter of the ANC controller to the changing leakage.

It should be noted that although the term "control filter" is used here in connection with G_adapt(z) which can be frequency dependent, in one embodiment the control filter is updated only by setting the gain of its constituent gain stage, where this gain stage provides positive gain, or negative gain (attenuation), that is fixed across the full bandwidth the filter. The specification for G_adapt(z) in that case could just be a single gain value.

In another embodiment, a response associated with the computed S_hat filter is compared to a predetermined response as follows. A direct form or difference equation form of the computed S_hat filter is converted into a transfer function (a frequency domain version of the impulse response of the S_hat filter). Strength of a given frequency band in the transfer function is then computed and compared to a predetermined target strength. A look up table or an online computation (based on a result of comparing with the target strength) may yield the new digital filter coefficients of the control filter.

The above-described techniques for adapting an ANC control filter in accordance with the current acoustic leakage condition may be used with feed-forward, feedback and hybrid approaches.

In a feedback embodiment, the overall control filter may include the series connection of two components, Gadapt(z) and Gfixed(z). In one embodiment, the specifications of a number of different shelf filters are stored in the device for Gadapt(z), each having a sloping gain profile, e.g. positive gain, zero gain, or negative gain (attenuation), in a low frequency band, and essentially a fixed gain profile (e.g., zero gain) in a high frequency band. In this manner, G_adapt(z) as a variable shelf filter may be placed in series with G_fixed(z) where the latter may be pre-determined offline to define the response of the overall control filter in the high frequency band. In another embodiment, G_adapt(z) may also include a gain stage (e.g., providing positive or negative gain that is fixed across the full bandwidth the filter but that is variable), whose gain value may be specified as part of the specification for G_adapt(z).

In a feed forward case, the control filter may be the combination of a low frequency component $W_{LF}(z)$ and a series-connected high frequency component $W_{HF}(z)$. The latter is being adapted by an LMS adaptive ANC algorithm (e.g., filtered-x LMS, or other suitable adaptive algorithm that uses the reference signal x), while the former is being adapted by an acoustic estimation process.

In a hybrid scenario, the anti-noise is produced by the following combination: the input of the control filter Gadapt (z) is coupled to a signal derived from an output of the error microphone (the feedback portion of the anti-noise), while the output of the control filter is combined with the output of a W-filter the latter being adapted by, for example, an LMS adaptive ANC algorithm (the feed forward anti-noise producing portion).

In yet another hybrid embodiment, the anti-noise is produced by the combination of control filters Gadapt(z) and W(z), the latter being adaptively controlled by for example a filtered-x LMS ANC engine and where the S_hat filter is computed online. An automatic gain control (AGC) process is performed that computes strength of a signal derived from the error microphone. The AGC process compares the computed strength to a target, and based on the comparison selects one of several previously determined filter specifications. The control filter Gadapt(z) is then configured in accordance with the selected filter specification. Note that this is a different approach to the leakage estimation process described above in which a strength computation is performed upon a response of the current S_hat(z) (based on which the appropriate specification for the control filter is selected).

Figure 1:
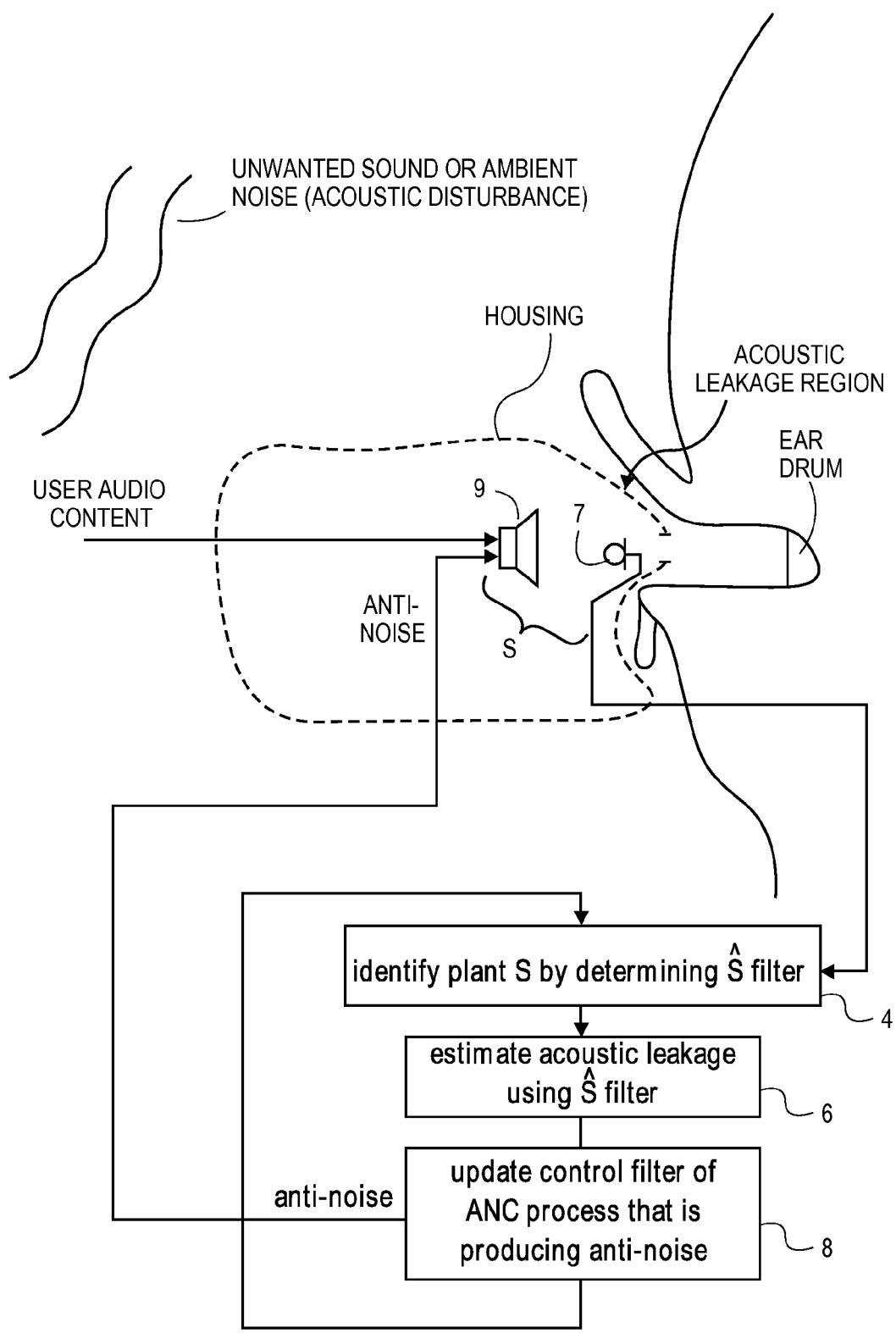
FIG. 1 is a block diagram of part of a consumer electronics personal listening system or device in which an embodiment of the invention can be implemented.

FIG. 1 is a block diagram of part of a consumer electronics personal listening system or device in which an embodiment of the invention can be implemented. The diagram is also used here to describe operations that are part of a method for in-the-field use of the personal listening device or system, in which an ANC process is performed. The personal listening system or device depicted here has a housing in which a speaker driver system 9 is located in addition to an error microphone 7. The housing, also referred to as a speaker housing, is to be held against or inside a user's ear as shown, with the error microphone 7 and speaker driver system integrated therein. The speaker driver system 9 is to convert an audio signal, which may include user audio content or an ANC training audio sweep signal, into sound. This sound will be heard by the user in addition to unwanted sound or ambient noise (also referred to as acoustic disturbance) that manages to leak past the speaker housing and into the user's ear canal. The housing may be, for example, that of a wired or wireless headset, a loose-fitting earbud, a supra-aural headphone, or an earpiece speaker portion of a mobile phone handset. In the case of an earphone (headphone), the user audio content may be delivered through a wired or wireless connection (not shown) from an audio source device such as a smartphone, a tablet computer, a laptop computer (e.g., via a Bluetooth link). In all of these instances, there is a variable acoustic leakage region where the disturbance can leak past the housing and into the ear canal. The anti-noise produced by the speaker driver system 9 based on an output of the control filter should attenuate at least some of this disturbance as heard by the user.

Although not shown in FIG. 1, in some instances the housing may also include a reference microphone which would be positioned typically at an opposite end or side of the housing as the error microphone 7 and the speaker driver system 9, in order to better pick up the unwanted acoustic disturbance prior to its passing into the ear canal. A signal derived from the reference microphone output can be used by a feed forward ANC system, and in particular may be fed to an input of the control filter.

Although not shown in FIG. 1, signals from the error microphone 7 and optionally a reference microphone are produced or converted into digital form for use by an ANC controller, which implements digital signal processing operations upon signals derived from the microphone signals to produce the anti-noise signal. The anti-noise signal is then converted into sound by the speaker driver system 9. It should be noted that in some cases, the speaker driver system 9 may have a single driver that receives both the user audio content and the anti-noise (which have been combined into a single audio signal being fed to a single driver). The ANC controller operates while the user is, for example, listening to a digital music file that is stored in the audio source device or while the user is conducting a conversation with a far-end user of a communications network in an audio or video phone call.

The ANC controller, or the ANC process that is running in the personal listening device, identifies the plant S by estimating the secondary path acoustic transfer function S(z) which as depicted in FIG. 1 refers to the path from the input to the speaker driver system to an output of the error microphone 7. The plant S can be identified (operation 4) using any suitable technique. For example, the definition of the S_hat filter may be automatically computed online or updated during in the field use, by an adaptive control process, based on a user audio content signal or ANC training signal and the error microphone signal. Alternatively, the S_hat filter coefficients can be accessed from memory, within the personal listening audio device, wherein the memory has stored therein different, previously determined versions of the S_hat filter.

Still referring to FIG. 1, a process of adapting the ANC control filter in accordance with the current acoustic leakage condition may proceed as follows. Such a process may be performed by a digital acoustic estimation and control filter controller that as explained below is to use information in the S_hat filter to estimate size of the acoustic leakage and in response adjust a programmable digital filter portion of the control filter to compensate for the leakage.

Once the S_hat filter has been determined (operation 4), the process estimates the present acoustic leakage, using information in the S_hat filter (operation 6). Viewed another way, a response associated with the computed S_hat filter is compared to a predetermined response that is stored in the audio device. Several techniques for doing so will be described in detail below. The process then continues with updating the ANC control filter, based on results of the estimate acoustic leak (operation 8). In other words, the control filter is adjusted, including one or more of its parameters, in accordance with the comparison between a response that is associated with the present S_hat filter and a predetermined response that is stored in the audio device.

Viewed another way, the acoustic estimation and control filter controller may compute a measure of an output signal of the S_hat filter while stimulating the S_hat filter with a predetermined input signal, and is to then estimate size of the acoustic leakage by comparing the computed measure of the output signal to a target. Alternatively, the controller can compute a transfer function of the S_hat filter and is to then estimate size of the acoustic leakage by comparing strength of a frequency band of the transfer function to a target. In both cases, the controller may then, based on a result of the comparison with the target, obtain an updated specification of the programmable digital control filter.

Figure 3:
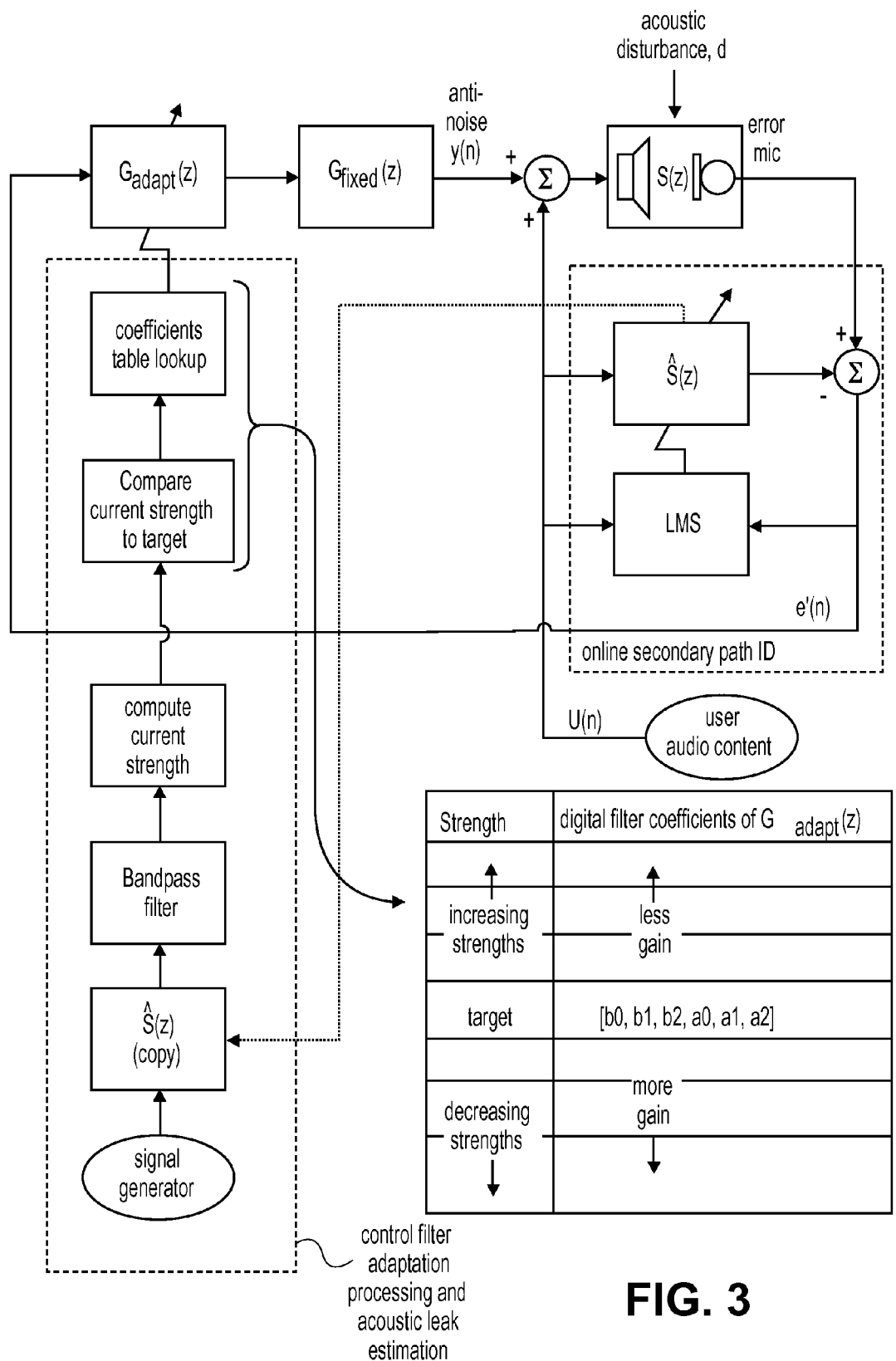
FIG. 3 is a detailed block diagram of a personal listening audio device in which acoustic leak estimation and control filter adaptation processing is performed to enhance the ANC.

Turning now to FIG. 3, this is a block diagram of an embodiment of the invention in which the control filter, Gadapt(z) in combination with Gfixed(z), has an input coupled to receive a signal derived from an output of the error microphone, and more specifically the ANC residual error signal e'(n). This is similar to a feedback ANC system. The S_hat filter in this case is computed online, using an adaptive process, here an LMS adaptive filter algorithm. The acoustic leak estimation is performed as follows. A response associated with the computed S_hat is computed by feeding a test signal to an input of the S_hat filter, and computing strength of an output of the S_hat filter to the test signal. The test signal may be white noise, an impulse, or other suitable stimulus that contains content in a frequency band of interest. The computed strength is then compared with a target. The control filter is adjusted, based on a result of comparing with the target strength. This may include for example a full set of digital filter coefficients which are then applied to update the definition of the control filter. As seen in the example of FIG. 3, a stored lookup table may have multiple groups of digital filter coefficients, wherein each group of coefficients can define the control filter and is associated with a respective one of the different acoustic leakage scenarios that were tested offline (see FIG. 2). Alternatively, instead of the groups of digital filter coefficients, the look up table may contain gain values that are merely adjustments to a frequency-independent gain stage that is part of the control filter.

In one case, the strength computation may be limited to a specified frequency band that is expected to exhibit strong differences between different leak conditions, e.g. between 100 Hz and 1 kHz, or between 300 Hz and 800 Hz. The frequency band of interest may also depend on how much reliable information is contained in S_hat about the acoustic leakage. This may depend on the resolution of S_hat, which in turn depends on how long the digital S_hat filter is. Resolution may be defined as the sampling rate divided by the number of coefficients that make up S_hat, such that a longer filter is needed if the frequency band of interest is to extend to lower frequencies.

In another embodiment, the acoustic leak estimation is performed as follows. A response associated with the computed S_hat filter is computed by converting the computed S_hat filter into its transfer function, and computing strength of a given frequency band in the transfer function. The computed strength is then compared to a target strength. The control filter is adjusted based on a result of comparing with the target strength that yields an updated specification for the control filter.

In one embodiment, the control filter includes at least a first component filter $G_{fixed}(z)$ in series with a second component filter $G_{adapt}(z)$. Adjusting the overall control filter (based on acoustic leak estimation processing) in that case may involve updating the second component filter but not the first component filter. This arrangement may be particularly beneficial in the following situation. If a finite impulse response (FIR) design is to be used for implementing the entire control filter, the filter could be too long, and therefore impractical, if it is to provide the needed resolution at low frequencies, e.g. less than 1 kHz. A better approach in that case is to split the overall control filter into at least two components, namely at least one fixed component and at a least one variable component, connected in series. The fixed component may have a fixed gain, e.g. essentially zero gain, at low frequencies, e.g. less than 3 kHz, and a different (but also fixed) gain response at high frequencies, while being selected to be fairly short. This is permissible since most of the variation in the frequency spectrum of the control filter (as a function of different acoustic leak conditions) is below 3 kHz, and its fixed high frequency component can be estimated during offline testing of different acoustic leakage scenarios and then stored in the audio device for in-the-field use. In one embodiment, the fixed component may be FIR or it may be infinite impulse response (IIR), while the variable component may be IIR, e.g. a single biquad, or a higher order filter.

Figure 4:
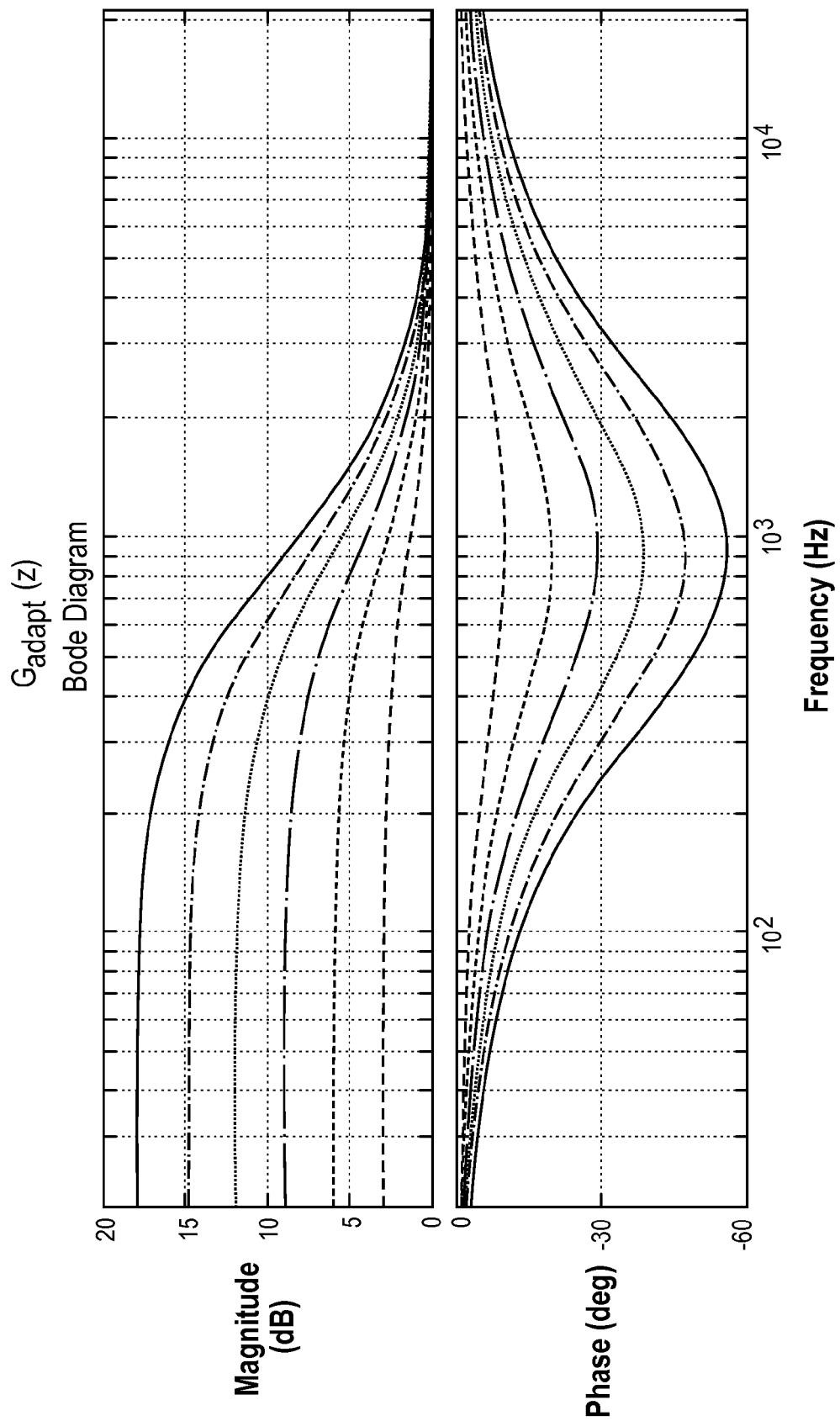
FIG. 4 is a Bode plot of several example control filters $G_{adapt}(z)$.

In one embodiment, each specification for Gadapt(z) refers to a respective low frequency shelf filter, e.g. having a knee between 200 Hz and 600 Hz with different low frequency gains but essentially zero high frequency gain, e.g. above 3 kHz. Examples of such shelf filters are depicted by the transfer functions shown in FIG. 4. Note the following example (for purposes of explaining the concepts only and not limiting the invention): if a zero gain shelf filter happens to correspond to an "average" acoustic leakage scenario (see FIG. 2), then a positive gain shelf filter is selected when there is greater than average leakage, while a negative gain shelf filter is selected when there is lesser than average leakage. Of course, the average leakage scenario may be defined differently, i.e. it may be associated with a slightly positive gain or a slightly negative gain shelf filter.

Figure 5:
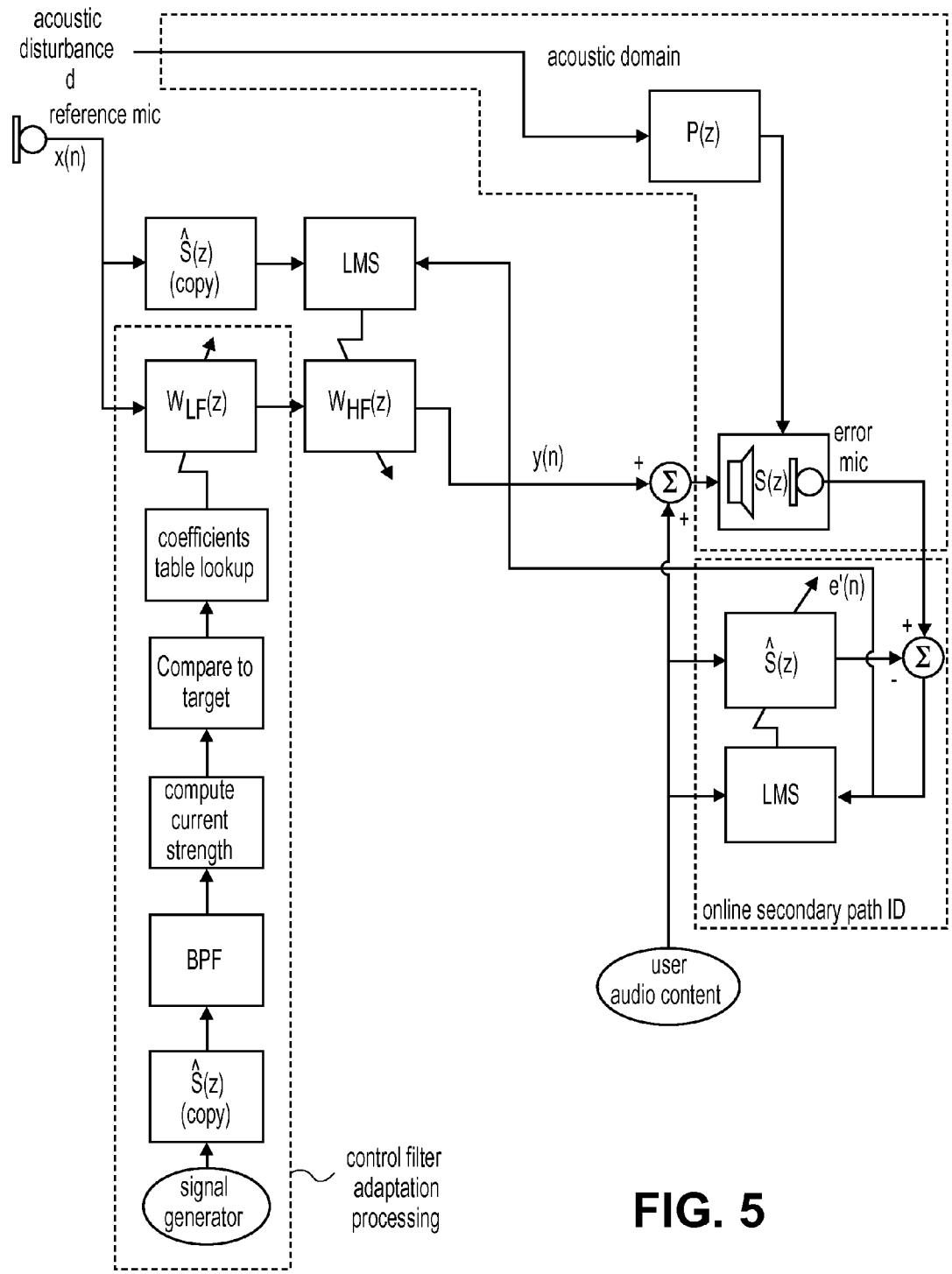
FIG. 5 is a block diagram of a personal listening device in which control filter adaptation processing is performed, in accordance with another embodiment.

Turning now to FIG. 5, in this embodiment of the invention, the control filter is given by the series combination of Wlf(z) and Whf(z), and has an input coupled to receive a signal derived from an output of a reference microphone, as in a feed forward ANC system. This is an example in which the high frequency portion of the control filter, Whf(z), is being adapted by a filtered-x LMS adaptive ANC algorithm, while the low frequency portion is under going adaptation based on an acoustic leak estimation process such as those described above in connection with FIG. 3. In other words, in the embodiment of FIG. 5, the first component filter Whf(z) is a variable filter which an adaptive ANC process adapts based on the signals derived from the outputs of both the reference and error microphone channels.

Figure 6:
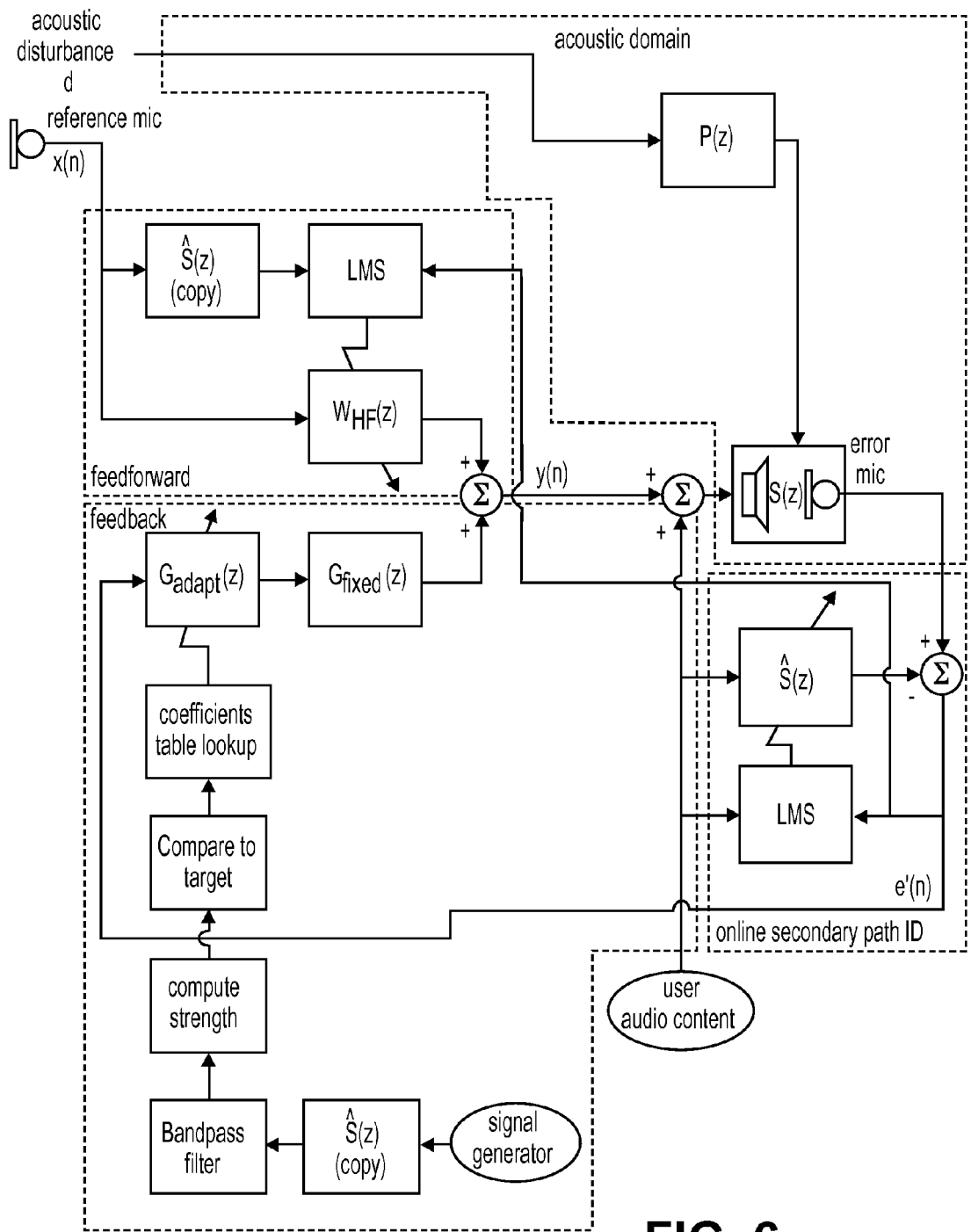
FIG. 6 is a block diagram of a hybrid adaptive ANC system and process, in accordance with another embodiment of the invention.

Referring now to FIG. 6, in this embodiment of the invention the anti-noise is produced by combining signals from two control filters, namely W(z) and the series combination Gadapt(z)-Gfixed(z). An adaptive ANC process adapts W(z) based on signals derived from the error and reference microphone channels (e.g., a filtered-x LMS adaptive algorithm). Meanwhile, the combination Gadapt-Gfixed, which is producing anti-noise based on the residual error signal e'(n), is being updated by an acoustic leakage estimation process such as those described above in connection with FIG. 3.

Figure 7:
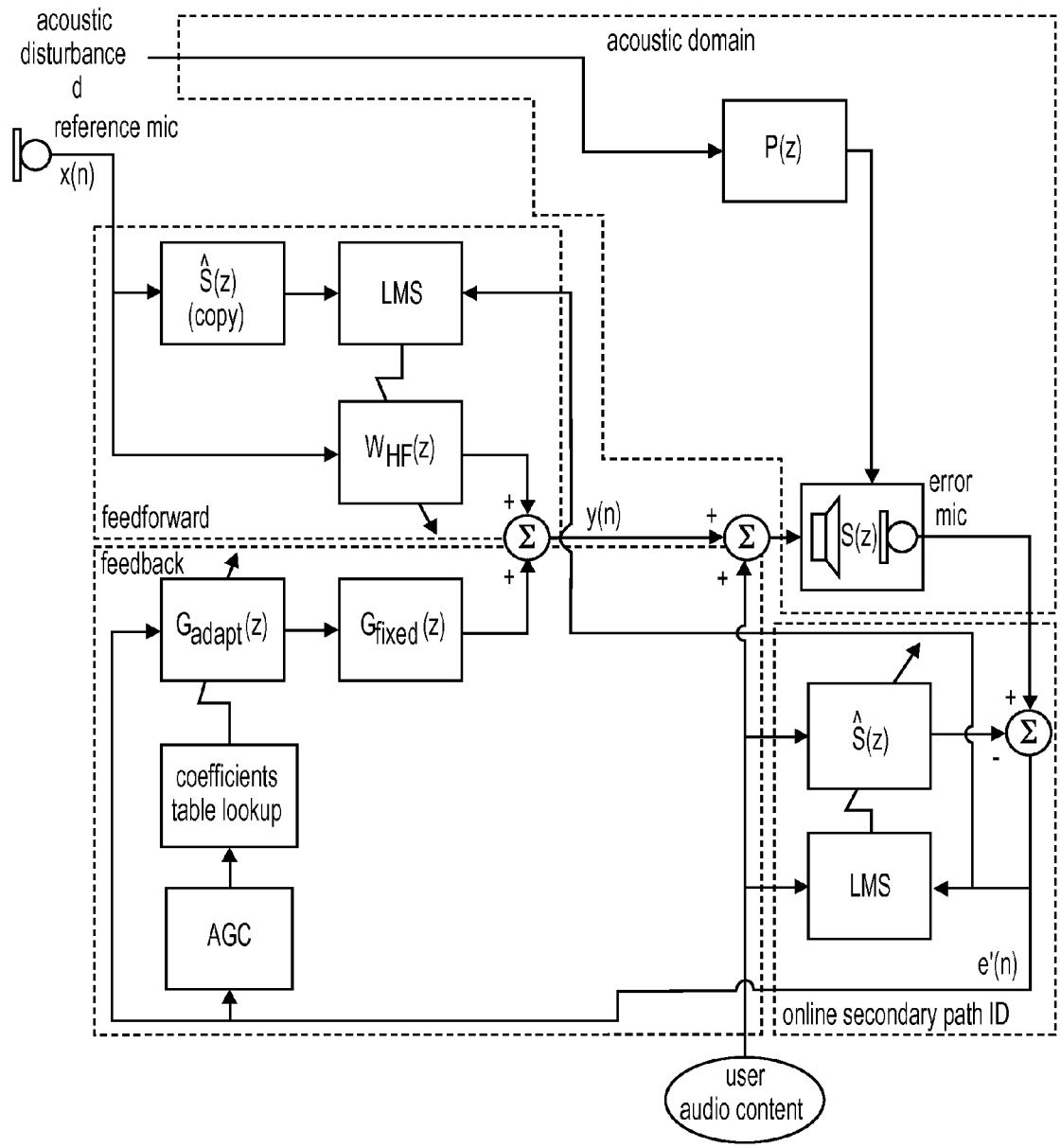
FIG. 7 is yet another hybrid approach for an ANC system, in accordance with another embodiment of the invention.

Turning now to FIG. 7, this block diagram depicts a personal listening audio device in which the following process is being executed. An ANC process is being performed during in-the-field use of the audio device, using a first control filter W(z) in the feed forward path and a second control filter Gadapt(z)-Gfixed(z) in the feedback path, whose outputs are combined, e.g. by a summation block as shown, to produce anti-noise by the device. An S_hat filter that estimates a signal path between an earpiece speaker of the device and an error microphone that are at a user's ear is once again being computed online, using an adaptive process. Another adaptive process, e.g. a filtered-x LMS ANC engine, is adapting the first control filter W(z) based on signals derived from a reference microphone and the error microphone.

Now, an acoustic leak estimation process is also being performed, as part of the feedback portion of anti-noise production, as follows. An automatic gain control process (AGC) is performed that computes strength of a signal derived from the error microphone, and compares the computed strength to a target. The target value could be based for example on the difference between a signal from the error microphone and a signal from the external reference microphone. Based on the comparison results of the AGC block, the acoustic leak estimation process then selects one of several previously determined filter specifications, aiming at minimizing the strength of a signal derived from the error microphone signal. The filter Gadapt(z) is then configured in accordance with the selected filter specification. Note that Gfixed(z) may be predetermined to provide the relatively unchanging portion of the response of the combination control filter Gadapt(z)-Gfixed(z)—see for example the discussion above in connection with FIG. 3. Here, it should be noted that in one embodiment, the AGC process may compute the strength of a desired frequency band that is a constituent part of the signal derived from the error microphone, which signal may be an ANC residual error signal.

As explained above, an embodiment of the invention may be a machine-readable medium (such as microelectronic memory) having stored thereon instructions, which program one or more data processing components (generically referred to here as a "processor") to perform the digital audio processing operations described above including signal strength measurement, filtering, addition, subtraction, inversion, comparisons, and decision making. In other embodiments, some of these operations might be performed by specific hardware components that contain hardwired logic (e.g., dedicated digital filter blocks). Those operations might alternatively be performed by any combination of programmed data processing components and fixed hardwired circuit components.

While certain embodiments have been described and shown in the accompanying drawings, it is to be understood that such embodiments are merely illustrative of and not restrictive on the broad invention, and that the invention is not limited to the specific constructions and arrangements shown and described, since various other modifications may occur to those of ordinary skill in the art. For example, the response of the estimated S^(z) filter may be analyzed at different frequency bands (not just a low band as suggested above) so as to provide input to change the parameters of the Gadapt(z) filter. Also, instead of a simple low frequency shelf, higher order filters with more complex response could be used as part of Gadapt(z). The description is thus to be regarded as illustrative instead of limiting.

What is claimed is:

1. A method for in-the-field use of a personal listening audio device, comprising:
performing an acoustic noise cancellation (ANC) process during in-the-field use of a personal listening audio device using a control filter to produce anti-noise by the device, wherein the process includes computing an S_hat filter that estimates a signal path between an earpiece speaker of the device and an error microphone that are at a user's ear;
comparing a response associated with the computed S_hat filter to a predetermined response that is stored in the device; and
adjusting the control filter of the ANC process in accordance with the comparison.

2. The method of claim 1 wherein the ANC process comprises an adaptive control process that automatically updates the S_hat filter during in-the-field use of the device.

3. The method of claim 1 wherein comparing a response associated with the computed S_hat comprises:
feeding a test signal to an input of the S_hat filter;
computing strength of an output of the S_hat filter to the test signal; and
comparing the computed strength with a target strength, and wherein
adjusting the control filter comprises one of a) performing a look up in a table to obtain updated digital filter coefficients of the control filter, b) computing updated digital filter coefficients of the control filter based on a set of filter characteristic parameters, and c) changing a frequency independent gain stage of the control filter, based on a result of comparing with the target strength.

4. The method of claim 3 wherein the target strength is a statistical central tendency of a plurality of leak conditions obtained when an instance of the audio device fits comfortably for a plurality of users.

5. The method of claim 1 wherein comparing a response associated with the computed S_hat filter comprises:
converting the computed S_hat filter into its transfer function;
computing strength of a given frequency band in the transfer function; and
comparing the computed strength to a target strength, and wherein
adjusting the control filter comprises one of a) performing a look up in a stored table to obtain updated digital filter coefficients of the control filter, b) computing updated digital filter coefficients of the control filter based on a set of characteristic filter parameters, and c) changing a frequency independent gain stage of the control filter, based on a result of comparing with the target strength.

6. The method of claim 5 wherein the stored table comprises a plurality of groups of digital filter coefficients, wherein each group of coefficients can define the control filter and is associated with a respective one of a plurality of different acoustic leakage scenarios.

7. The method of claim 6 wherein the plurality of groups of digital filter coefficients define a plurality of low frequency shelf filters.

8. The method of claim 1 wherein the control filter comprises a first component filter in series with a second component filter, wherein adjusting the control filter comprises updating the second component filter and not the first component filter.

9. The method of claim 8 wherein the control filter has an input coupled to receive a signal derived from an output of a reference microphone.

10. The method of claim 9 wherein the first component filter is a variable filter, the method further comprising:
performing an adaptive control process that adapts the first component filter based on the signals derived from the outputs of the reference and error microphones.

11. The method of claim 1 wherein the control filter has an input coupled to receive a signal derived from an output of the error microphone.

12. The method of claim 11 further comprising:
performing an adaptive control process that adapts a further control filter based on the signal derived from the error microphone and a signal derived from a reference microphone; and combining signals from the control filter and the further control filter to produce the anti-noise.

13. A method for in-the-field use of a personal listening audio device, comprising:
performing an acoustic noise cancellation (ANC) process during in-the-field use of a personal listening audio device using a first control filter and a second filter control whose outputs are combined to produce anti-noise by the device, wherein the process includes computing an S_hat filter that estimates a signal path between an earpiece speaker of the device and an error microphone that are at a user's ear, and performing an adaptive control process that adapts the first control filter based on signals derived from a reference microphone and the error microphone;
performing an automatic gain control process (AGC) that computes strength of a signal derived from the error microphone, compares the computed strength to a target strength, and based on the comparison selects one of a plurality of previously determined filter specifications; and
configuring the second control filter of the ANC process in accordance with the selected filter specification.

14. The method of claim 13 wherein the adaptive control process uses a filtered-x LMS adaptive algorithm.

15. The method of claim 13 wherein the AGC process computes strength of a frequency band that is a constituent part of the signal derived from the error microphone.

16. The method of claim 13 wherein the signal derived from the error microphone is a residual ANC error signal.

17. An acoustic noise cancellation (ANC) audio device comprising:
a speaker housing to be held against or inside a user's ear, the housing having integrated therein an error microphone and a speaker driver system, wherein the speaker driver system is to covert an audio signal and an anti-noise signal into sound and wherein there is acoustic leakage past the speaker housing and into the user's ear canal;
a programmable digital filter to produce the anti-noise signal;
an adaptive control system having an input coupled to an output of the error microphone and a further input coupled to the audio signal, the adaptive control system to compute an S_hat filter representing a signal path that is from an input of the speaker driver system to an output of the error microphone; and
a controller to use information in the S_hat filter to estimate size of the acoustic leakage and in response adjust the programmable digital filter to compensate for the leakage.

18. The ANC audio device of claim 17 wherein the speaker housing is an earbud housing.

19. The ANC audio device of claim 17 wherein the speaker housing is an earpiece speaker housing portion of a mobile phone handset.

20. The ANC audio device of claim 17 wherein the estimated size of the acoustic leakage is large when the speaker housing forms a loose seal with the user's ear, and small when the speaker housing forms a tight seal with the user's ear.

21. The ANC audio device of claim 17 wherein the controller is to compute a measure of an output signal of the S_hat filter while stimulating the S_hat filter with a predetermined input signal, and is to estimate size of the acoustic leakage by comparing the computed measure of the output signal to a target.

22. The ANC audio device of claim 17 wherein the controller is to compute a transfer function of the S_hat filter and is to estimate size of the acoustic leakage by comparing strength of a frequency band of the transfer function to a target.

23. The ANC audio device of claim 22 wherein the controller is to one of a) perform a look up in a table to obtain updated digital filter coefficients of the programmable digital filter, b) compute updated digital filter coefficients of the programmable digital filter based on a set of characteristic filter parameters, and c) change a frequency independent gain stage of the programmable digital filter, based on a result of said comparison to the target.

* * * * *